United States Patent [19]

Rodwell

[11] Patent Number: 4,623,786
[45] Date of Patent: Nov. 18, 1986

[54] TRANSIMPEDANCE AMPLIFIER WITH OVERLOAD PROTECTION

[75] Inventor: Mark J. W. Rodwell, San Mateo, Calif.

[73] Assignee: AT&T Bell Laboratories, Murray Hill, N.J.

[21] Appl. No.: 669,079

[22] Filed: Nov. 7, 1984

[51] Int. Cl.⁴ .............................................. H01J 40/14
[52] U.S. Cl. .................... 250/214 A; 330/59
[58] Field of Search ....... 250/214 R, 214 A, 214 AG; 330/59, 103, 296, 259; 307/311; 455/617, 619

[56] References Cited

U.S. PATENT DOCUMENTS

| | | | |
|---|---|---|---|
| 4,415,803 | 11/1983 | Muoi | 250/214 |
| 4,459,475 | 7/1984 | Flint et al. | 250/214 AG |
| 4,498,001 | 2/1985 | Smoot | 250/214 A |

Primary Examiner—David C. Nelms
Assistant Examiner—James G. Gatto
Attorney, Agent, or Firm—Volker R. Ulbrich

[57] ABSTRACT

The front end of an optical receiver circuit (10) is of the type having a field-effect device transimpedance amplifier (16,21) which receives at its input (14) the photocurrent of a photodiode (12). A field-effect device shunt impedance (26) to protect against amplifier overloading is connected between the input and ground through a decoupling capacitor (28). The shunt (26) is controlled by a controller (30), which has its input connected to the output (24) of the amplifier (16) and its output connected to the gate of the shunt (26). The controller (30) compares the output (24) of the amplifier (16) to a threshold reference voltage for determining whether to activate the shunt (26) and regulates the gate voltage of the shunt (26) by means of an AGC amplifier. A direct current feedback resistor (32) is connected between the output (24) of the amplifier (16) and the source of the shunt (26). This prevents the d.c. component of large photocurrents from significantly changing the input bias voltage level of the amplifier (16).

5 Claims, 1 Drawing Figure

TRANSIMPEDANCE AMPLIFIER WITH OVERLOAD PROTECTION

TECHNICAL FIELD

The invention relates to transimpedance amplifiers, particularly those for use in optical receivers for light guide systems.

BACKGROUND OF THE INVENTION

Optical receivers for light guide systems generally use a high frequency photodiode to convert the light signal to a photocurrent, which has both an a.c. (alternating current) and a d.c. (direct current) component. It is desirable to amplify the photocurrent signal to a higher voltage as early as possible in order to make it relatively insensitive to the introduction of ambient noise. To this end, optical receivers include a so-called "front end" transimpedance amplifier which raises the voltage level of the signal several orders of magnitude. The output of the front end is then further amplified and shaped in a linear channel section.

It is desirable for an optical receiver to have a wide dynamic range, so that it can be used for assorted cable lengths; each cable length will have a different light attenuation, and therefore a different light intensity output. A limiting factor in the dynamic range is the dynamic range of the transimpedance amplifier. Excessive a.c. or d.c. input will cause the amplifier to saturate.

The excess a.c. component of the signal can be shunted away by means of a shunt transistor which is controlled by a controller responsive to the output of the transimpedance amplifier. Such an arrangement is described in U.S. Pat. No. 4,415,803 issued to Tran V. Muoi Nov. 15, 1983 and assigned to the present assignee. When the circuit is implemented in FET (field effect transistor) technology, however, the shunting action of the shunt impedance has the effect of disturbing the bias voltage at the input port of the transimpedance amplifier. For an FET amplifier, it is important that this voltage be maintained accurately at an appropriate bias level. Otherwise, the input transistors of the amplifier will not be operating in their proper gain mode.

One way of maintaining the proper bias at the input of the amplifier is by means of a current mirror circuit, as is described in the copending application Ser. No. 401,521 now U.S. Pat. No. 4,498,001 entitled "Transimpedance Amplifier For Optical Receivers," which is also assigned to the present assignee. It would be desirable to have an alternative means of maintaining the proper bias which requires less complexity.

SUMMARY OF THE INVENTION

In accordance with the novel circuit of the present invention, an optical receiver front end, which includes an FET shunt transistor, is provided with a d.c. feedback impedance element between the source of the shunt transistor and the output of its transimpedance amplifier. A capacitor is connected between the source of the shunt impedance and ground potential, completing the shunt path of a.c. signals from the photodiode to ground.

The d.c. shunt path consists of the FET shunt transistor and the d.c. feedback impedance. The d.c. feedback impedance arrangement has a "self-biasing" effect of preventing a rise in the d.c. bias level at the amplifier input. If the input d.c. voltage rises, the corresponding drop in the amplifier output level is fed back to the source of the shunt transistor, causing the shunt transistor to draw more current from the input node and causing the input to drop back to the required d.c. level. With this arrangement, control of both the a.c. and d.c. transimpedance is achieved and the input bias level of the amplifier is accurately controlled with a minimum of complexity.

DETAILED DESCRIPTION

Figure 1:
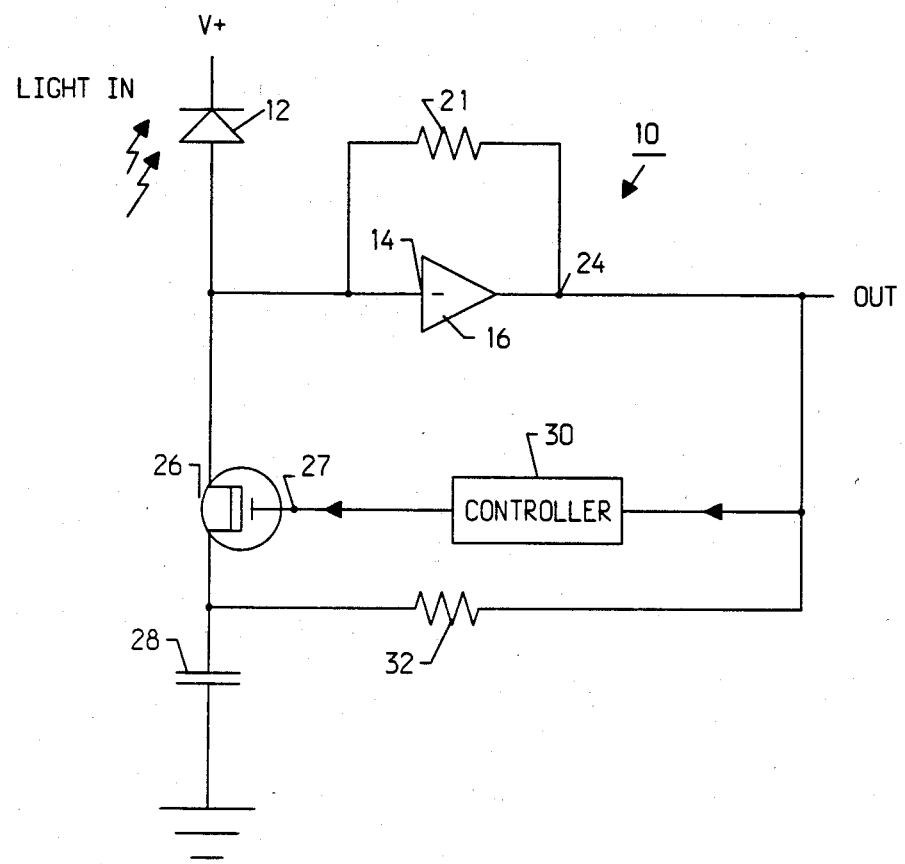
FIG. 1 is a schematic circuit diagram of a transimpedance amplifier circuit in accordance with one embodiment of the present invention.

The optical receiver front end circuit 10 shown in FIG. 1 of the drawings includes a high performance photodiode 12 which has one side connected to a positive voltage supply node V+ and the other side connected to an inverting input port 14 of an FET amplifier 16. A transimpedance feedback resistor 21 is connected between the output port 24 of the amplifier 16 and the input port 14 to form a transimpedance amplifier stage. An input shunt impedance in the form of an FET device 26 has its drain connected to the inverting input port 14 of the amplifier 16, and its source connected to one side of a decoupling capacitor 28. The other side of the capacitor 28 is connected to ground potential. A controller 30, which may be any one of a number of known types for performing this control function, has its input connected to the output port 24 of the amplifier 16 and has its output connected to the the gate of the shunt FET 26. A d.c. feedback impedance in the form of a resistor 32 is connected between the output port 24 of the amplifier 16 and the source of the shunt FET 26.

In the operation of the circuit 10, the photodiode 12 will conduct a signal photocurrent in response to the incoming light signal. This photocurrent is applied to the input 14 of the transimpedance amplifier stage, which consists of the amplifier 16 and the feedback resistor 21. The transimpedance amplifier stage converts the signal current into a signal voltage at the output 24 of the amplifier 16. If the a.c. component of the voltage at the output 24 of the amplifier 16 exceeds some predetermined threshold voltage level, the controller 30 will raise the voltage at the gate of the shunt FET 26 to cause the shunt FET 26 to conduct.

The excess a.c. component of the signal current is then shunted through the shunt FET 26 and the capacitor 28 to ground. The shunt FET 26 and the controller 30 thus form an automatic gain control circuit for the a.c. component of the signal at the input 14 of the amplifier 16.

The d.c. feedback resistor 32 applies the d.c. potential of the output 24 of the amplifier 16 to the source of the shunt FET 26. The amplifier 16, the shunt FET 26, and the d.c. feedback resistor 32 form a d.c. feedback loop to the input node 14, since any a.c. which is also fed back through the d.c. feedback resistor 32 is led to ground by the decoupling capacitor 28. Should the d.c. potential of the input 14 to the amplifier 16 increase above its normal operating bias voltage, the output voltage 24 of the amplifier 16 will drop, thereby decreasing the voltage at the source of the shunt FET 26. This causes the shunt FET 26 to draw more d.c. current from the input node 14 of the amplifier 16, thus bringing the voltage of the input node 14 back to its correct level.

In this manner, the input 14 and output 24 d.c. voltages of the amplifier 26 are maintained at their correct levels, and the source and drain of the shunt FET 26 are maintained at nearly the same voltage, so that the the shunt FET 26 is operating in its voltage-controlled-resistor region.

At the moderate-to-high light input levels at which the automatic gain control circuit is operating, the d.c. transimpedance is equal to the value of the d.c. feedback resistor 32. The d.c. feedback resistor 32 has a small enough value that for d.c. the transimpedance will be too small to allow substantial changes in the d.c. potential at the output 24 of the amplifier 16, even with large d.c. signal currents. With appropriate design of the shunt FET 26 and the amplifier 16, the mid-band transimpedance can be made small enough to prevent a.c. overload of the receiver as a result of excessive optical input power. At moderate levels of shunt FET operation, the transimpedance is dominated by the shunt FET 26 action, and the effect of the feedback resistor 21 may be neglected.

Transimpedance amplifier circuits, such as the circuit 10, find use in many different applications. For any particular application it is desirable to design the circuit with the devices and parameters best suited for that purpose. For example, if the circuit is for relatively high frequency optical input, the photodiode can advantageously be a PIN photodiode especially designed for such a frequency range, but an avalanche photodiode is likely to also be suitable. Likewise, the shunt FET can in that case be a high frequency gallium arsenide FET device. It will be clear to those skilled in the art that the shunt FET may be either an N-channel or P-channel device and that it also my be an enhancement mode or a depletion mode device. Appropriate modifications of the circuit 10 for accommodating such devices will also be apparent. The amplifier may be of any type which requires an input bias voltage to be maintained with some degree of accuracy. If it is desired to have the flattest low-frequency response, then the d.c. feedback resistor should have a value of about the minimum "on" resistance of the shunt FET times the voltage gain of the amplifier. However, this is a relatively minor consideration.

In the circuit 10 of FIG.1 the decoupling capacitor 28 is shown connected at one side to ground potential. It should be understood that ground potential in this context means some reference potential, that being a potential which is substantially constant relative to the signal.

The value of the d.c. feedback resistor is not particularly critical, provided that the value is not so large that the voltage drop across the d.c. feedback resistor becomes excessive for the operation of the circuit. Typically, the value is likely to be in the range of from 500–3000 ohms. The impedance function of the d.c. feedback resistor could also be performed by an inductance element, such as a choke coil. In general, however, a resistance element is likely to be more suitable for a given circuit implementation.

What is claimed is:

1. A transimpedance amplifier circuit, comprising:
   an amplifier having an input and an output
   a first feedback impedance element connected between the input and the output of the amplifier;
   a field-effect shunt resistor having one side of its conduction path connected to the input of the amplifier;
   a decoupling capacitor connected at one side to another side of the conduction path of the transistor and connected at another side to a reference potential means, and
   a shunt transistor control means having an input connected to the output of the amplifier and having its output connected to the control electrode of the shunt transistor,
   wherein the improvement comprises:
   a second feedback impedance element connected between the output of the amplifier and the common node of the shunt transistor and the capacitor.

2. The circuit defined in claim 1 comprising a photodiode connected between the input of the amplifier and a bias voltage means.

3. The circuit defined in claim 2 wherein the amplifier is of the field-effect device type.

4. The circuit defined in claim 2 wherein the second feedback impedance element has a value of about the minimum "on" resistance of the shunt transistor times the voltage gain of the amplifier.

5. The circuit defined in claim 4 wherein the second feedback impedance has a resistance value in the range of from about 500 ohms to about 3000 ohms.

* * * * *

UNITED STATES PATENT AND TRADEMARK OFFICE
CERTIFICATE OF CORRECTION

PATENT NO. : 4,623,786

DATED : November 18, 1986

INVENTOR(S) : Mark J. W. Rodwell

It is certified that error appears in the above-identified patent and that said Letters Patent is hereby corrected as shown below:

In the Specification col. 3, line 4, delete "the", last occurrence, and
          line 34, "my" should read --may--.

In the Claims
  Claim 1
    col. 4, line 19, "resistor" should read --transistor--.

Signed and Sealed this

Twenty-fourth Day of January, 1989

Attest:

DONALD J. QUIGG

*Attesting Officer*        *Commissioner of Patents and Trademarks*